United States Patent [19]

Apraez et al.

[11] Patent Number: 5,722,079
[45] Date of Patent: Feb. 24, 1998

[54] TWO BAND 25 CHANNEL CORDLESS TELEPHONE SYSTEM

[75] Inventors: Manuel Apraez, Minoa; Michael John Bonczek, Constantia; Sung Hee Kim, Liverpool; Hung Chi Lai, South Rochester, all of N.Y.

[73] Assignee: Thomson Consumer Electronics, Inc., Indianapolis, Ind.

[21] Appl. No.: 632,342

[22] Filed: Apr. 10, 1996

[30] Foreign Application Priority Data

Apr. 28, 1995 [GB] United Kingdom ............... 9509145

[51] Int. Cl.$^6$ .................................................. H04M 11/00
[52] U.S. Cl. .................. 455/464; 455/188.1; 455/191.1; 455/193.1; 455/296
[58] Field of Search .................. 379/61, 59; 455/33.1, 455/33.2, 33.4, 426, 427, 434, 450, 455, 464, 509, 516, 553, 62, 63, 77, 120, 188.1, 191.1, 191.3, 193.1, 193.2, 296, 452

[56] References Cited

U.S. PATENT DOCUMENTS

| | | | |
|---|---|---|---|
| 4,115,737 | 9/1978 | Hongu et al. | 455/191.3 |
| 4,802,238 | 1/1989 | Fischer et al. | 455/191.3 |
| 4,972,509 | 11/1990 | Maejima | 455/188.1 |
| 5,023,939 | 6/1991 | Hori | 455/188.1 |
| 5,105,162 | 4/1992 | Fleissner et al. | 455/336 |
| 5,406,615 | 4/1995 | Miller, II et al. | 379/59 |
| 5,428,669 | 6/1995 | McCarthy | 455/62 |
| 5,428,829 | 6/1995 | Osburn et al. | 455/193.2 |
| 5,483,209 | 1/1996 | Takayama | 455/188.1 |
| 5,499,056 | 3/1996 | Pugel | 455/188.1 |
| 5,535,432 | 7/1996 | Dent | 455/77 |
| 5,548,821 | 8/1996 | Coveley | 455/63 |

FOREIGN PATENT DOCUMENTS

| | | |
|---|---|---|
| 2265521 | 9/1993 | United Kingdom. |
| WO89/07865 | 8/1989 | WIPO. |

*Primary Examiner*—Curtis Kuntz
*Assistant Examiner*—Binh K. Tieu
*Attorney, Agent, or Firm*—Joseph S. Tripoli; Peter M. Emanuel; Robert D. Shedd

[57] ABSTRACT

A cordless telephone system divides the 25 channel bandwidth allocated by the Federal Communications Commission (FCC) into two bands in order to obtain improved noise performance. The front end is tuned to the center frequency of each band and the tuning of the receiver to specific channel frequencies is accomplished via a PLL.

6 Claims, 2 Drawing Sheets

TWO BAND 25 CHANNEL CORDLESS TELEPHONE SYSTEM

FIELD OF THE INVENTION

The subject invention generally concerns cordless telephone systems and specifically concerns a 25 channel cordless channel system.

BACKGROUND OF THE INVENTION

In the United States, the Federal Communications Commission (FCC) has very recently allocated a bandwidth sufficiently wide to accommodate 25 cordless telephone channels.

An increase of channels from 10 to 25 is advantageous to a user in that more available channels means less chance of interference with another telephone call being placed by a neighbor on the same channel. However, the allocation of 25 channels causes the bandwidth required of modern cordless telephones to increase. Increased bandwidth, as will be shown below, causes noise to increase to an unacceptable level.

SUMMARY OF THE INVENTION

A cordless telephone system partitions the 25 channel bandwidth allocated by the Federal Communications Commission (FCC) into two distinct bands in order to obtain improved noise performance. The "front ends" (i.e., input tuned circuits) of the receiver circuitry in the handset and the transmitter circuitry in the base unit of a cordless telephone set according to the invention are tuned to the center frequency of each band, and the receiver is tuned by a PLL to specific channel frequencies within a chosen band.

DETAILED DESCRIPTION OF THE DRAWING

Figure 1:
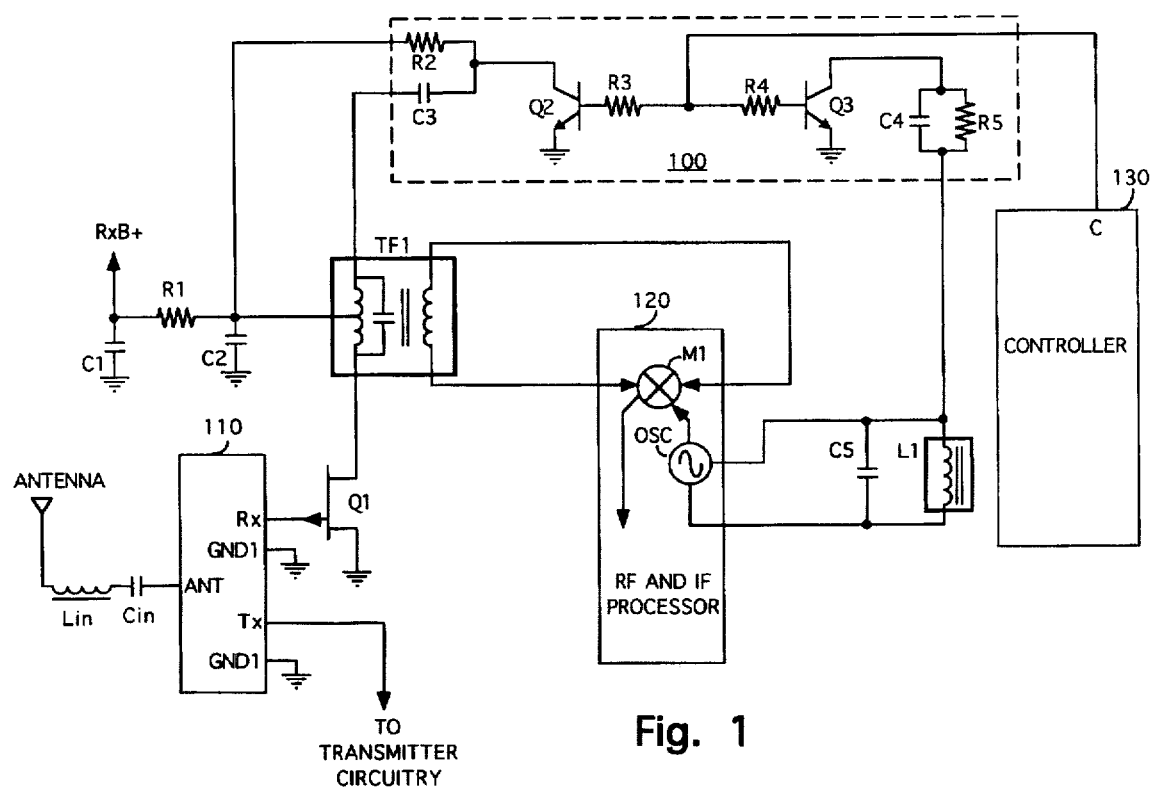
FIG. 1 shows in schematic form a portion of a cordless telephone handset according to the subject invention.

Twenty-five channel cordless phones are in many ways similar to commonly-available ten-channel cordless phones. The Federal Communications Commission (FCC) in the United States has increased the frequency spectrum allocated to cordless telephony because a twenty-five channel system requires a wider bandwidth than does a ten Channel system.

The transmitter frequencies allocated to the base unit are, of course, the receiver frequencies of the handset, and are shown in Table 1, below.

TABLE 1

| Channel | Transmitter Frequency |
|---|---|
| 1 | 43.72 MHz |
| 2 | 43.74 MHz |
| 3 | 43.82 MHz |
| 4 | 43.84 MHz |
| 5 | 43.92 MHz |
| 6 | 43.96 MHz |
| 7 | 44.12 MHz |
| 8 | 44.16 MHz |
| 9 | 44.18 MHz |

TABLE 1-continued

| Channel | Transmitter Frequency |
|---|---|
| 10 | 44.20 MHz |
| 11 | 44.32 MHz |
| 12 | 44.36 MHz |
| 13 | 44.40 MHz |
| 14 | 44.46 MHz |
| 15 | 44.48 MHz |
| 16 | 46.61 MHz |
| 17 | 46.63 MHz |
| 18 | 46.67 MHz |
| 19 | 46.71 MHz |
| 20 | 46.73 MHz |
| 21 | 46.77 MHz |
| 22 | 46.83 MHz |
| 23 | 46.87 MHz |
| 24 | 46.93 MHz |
| 25 | 46.97 MHz |

Unlike the foregoing, the bandwidth of the receiver frequencies of the base unit (i.e., the transmitter frequencies of the handset) encompasses only 1.23 MHz (49.99–48.76 MHz) because the newly added fifteen channels are contiguous with the existing ten channels. The resulting bandwidth of 1.23 MHz is suitably narrow enough to avoid introducing noise problems. However, the base unit transmitter frequencies encompass 3.25 MHz bandwidth (46.97–43.72 MHz), which is sufficiently wide enough to raise noise-related problems.

In the handset the situation is exactly the reverse in that the receiver has a larger bandwidth than the transmitter, becasuse the newly added fifteen channels are not contiguous with the existing ten channels. Thus, the handset requires a different solution in order to comply with FCC requirements such as, sensitivity. It is important to note that ten-channel cordless phones occupy a 360 kHz bandwidth (46.97–46.61 MHz) for the base unit transmitter, and a 320 kHz bandwidth (49.99–49.67 MHz) for the Handset transmitter. In contrast, in a twenty-five channel cordless phone, both the base unit transmitter, and the handset receiver require 3.25 MHz bandwidth.

The subject invention is directed to the problem that the increased bandwidth requirement necessary to provide twenty-five channel service causes an increase in noise, as explained below.

One may calculate the noise voltage (e) by using the following equation (EQ 1), assuming a matched load of 50 ohms at a temperature of 17° C., and an approximate ten channel telephone bandwidth of 300 kHz.

$$e = (R \times K \times T \times B)^{0.5} \quad \text{(EQ 1)}$$

where

R=standard 50 ohm system impedance
K=a constant factor: 1.38E-23
T=temperature in degrees Kelvin (i.e., 290° K.)
B=bandwidth in Hz (i.e., approximately 300 kHz)
Employing these values in Equation 1 yields:
  $e = (50 \times 1.38E\text{-}23 \times 290 \times 3E5)^{0.5}$
  $e = 0.245$ μv (microvolts)
Performing the same calculation for a twenty-five channel phone requiring a bandwidth of 3.25 MHz yields:
  $e = (50 \times 1.38E\text{-}23 \times 290 \times 3.25E6)^{0.5}$
  $e = 0.806$ μv (microvolts)
The resulting 0.806 μv noise value corresponds to a 10.34 dB higher noise than is found in ten channel phones currently manufactured by companies such as, Thomson Consumer Electronics, Inc. Indianapolis, Ind.

The task to be accomplished, therefore, is to reduce the elevated noise voltage caused by the FCC-mandated increase in bandwidth, while continuing to provide twenty-five channel service for a user.

It is herein recognized that the twin goals of lowering the noise level and providing twenty-five channel service for a user, can be realized by providing a bandswitched front end which divides the twenty-five channels into two bands, each of which requires only a fraction of the total bandwidth. In such a system, a first band encompassing 15 channels can occupy the frequency range from 43.72 MHz to 44.48 MHz (as shown in the leftmost columns of Table 1), and a second band encompassing the remaining ten channels can occupy the frequency range 46.61 MHz to 46.97 MHz (as shown in the rightmost columns of Table 1).

The front end (i.e., input tuned circuit) is tuned to one of two frequencies, each of which is approximately at the center of each band. The center frequencies are calculated by a geometric method rather than an arithmetic average because the geometric center better reflects actual performance. Thus, the center frequency for the lower band is calculated as shown in equation 2, below.

$$F_{C(lower)} = (f1 \times f2)^{0.5}$$
$$= (43.72 \times 44.48)^{0.5}$$
$$= 44.1 \text{ MHz}$$

EQ (2)

$$F_{C(upper)} = (f1 \times f2)^{0.5}$$
$$= (46.61 \times 46.97)^{0.5}$$
$$= 46.79 \text{ MHz}$$

The proper respective center frequency is chosen by a controller in accordance with which band is to be selected.

FIG. 1 shows a portion of the receiver circuitry of a handset according to subject invention. In FIG. 1, RF signals are received by an antenna and coupled via a series LC circuit comprising an inductor $L_{IN}$ and a capacitor $C_{IN}$ to the ANT input of a duplexer 110. Duplexer 110 couples RF signals to the antenna from transmitter circuitry (not shown), and couples RF signals from the antenna to the front end of the handset receiver circuitry. The front end comprises an antiresonant circuit including a transformer TF1 and its internal twenty pf (picofarad) tuning capacitor, and an amplifier transistor Q1. A switched power supply $R_xB+$ is filtered by a resistive pi-type filter C1, R1, and C2, and applied to a tap on the primary winding of transformer TF1. RF signals are coupled from the secondary of transformer TF1 to a mixer M1 located within RF and IF Processor 120. There the RF signals are mixed with signals generated by a local oscillator OSC, and the resulting product is further processed and demodulated in a known fashion.

The front end bandswitching circuitry 100, referred to above, comprises switching transistors Q2 and Q3, capacitor C2, base current limiting resistors R2 and R3, a collector resistor R4, and a parallel RC (resistor-capacitor) network R5, C3, and operates as follows. When the upper band is selected, transistor Q2 is nonconducting (i.e., "off"). TF1 is a variable inductor set to 578.5 nH (nanoHenries) to tune with its internal 20 pf capacitor to the above-noted 46.79 MHz center frequency. When it is desired to select the lower band, a controller 130 applies a control signal to the junction of base resistors R3 and R4 causing switching transistors Q2 and Q3 to conduct. The conduction of transistor Q2 connects capacitor C3 across a portion of the primary winding of transformer TF1, thereby decreasing the resonant frequency to approximately 44.10 MHz, the center frequency of the lower band.

Inductor L1 and capacitor C5 form a resonant circuit to tune local oscillator OSC to operate within the upper band. When it is desired to select the lower band, controller 130 applies the control signal to the junction of base resistors R3 and R4 causing switching transistors Q2 and Q3 to conduct. The conduction of transistor Q3 adds capacitor C4 to the oscillator tuned circuit, allowing oscillator OSC is cover the entire 25 channel oscillator frequencies.

Figure 2:
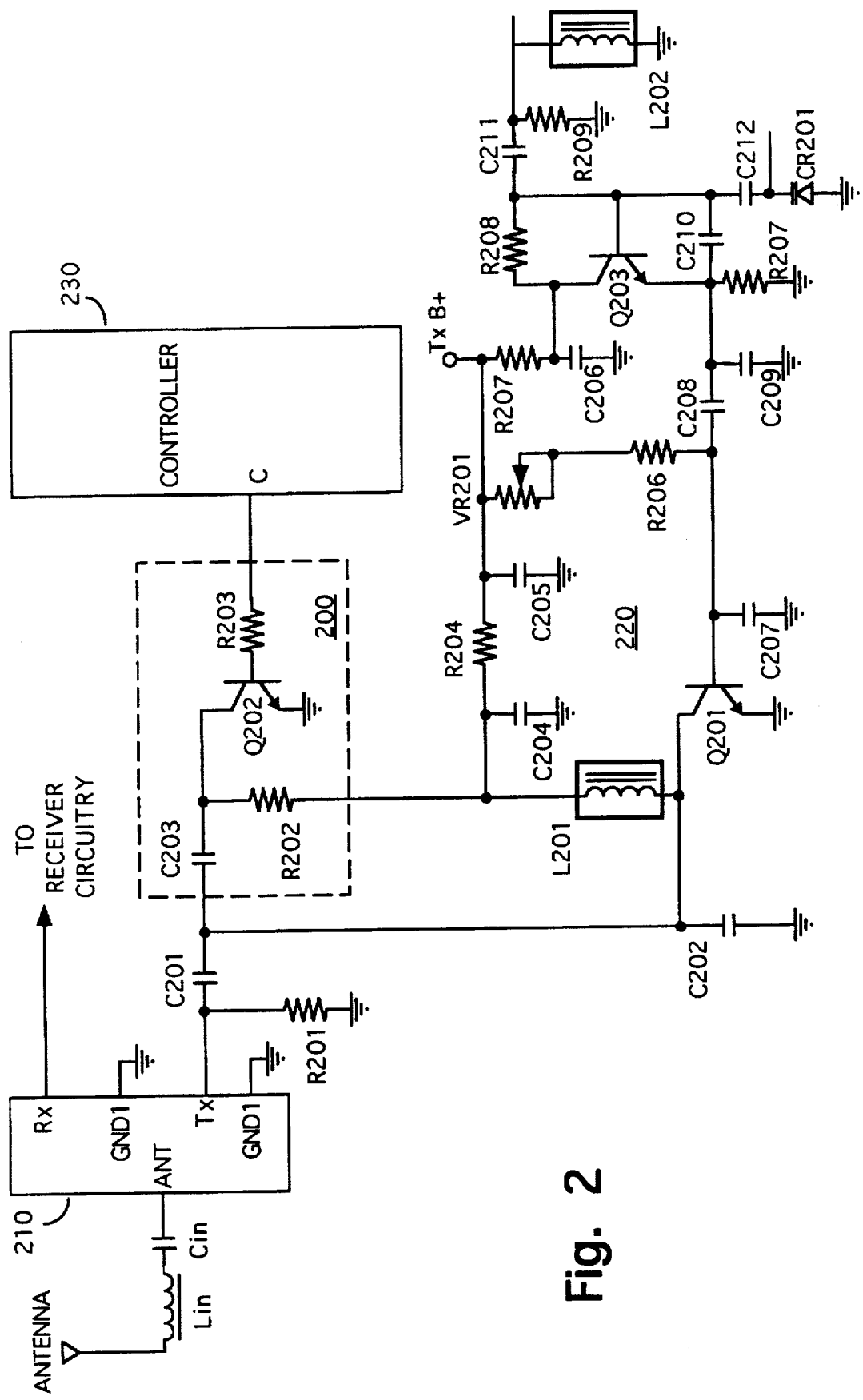
FIG. 2 shows in schematic form a portion of a cordless telephone base unit according to the subject invention.

Turning now to the transmitter circuitry of the base unit as shown in FIG. 2, note that only a portion of the transmitter output amplifiers 220 are shown, with the remaining (not shown) portions being well known. In operation, RF signals to be transmitted are amplified in amplifier 220 and applied to duplexer 210 via a coupling capacitor C201, and thereafter are applied to an antenna via a series LC arrangement $L_{IN}$, $C_{IN}$.

As will be explained below, an antiresonant circuit comprising L201, C202, C203, and C201 tunes to a center frequency of 46.79 MHz when a switching transistor Q202 is nonconducting (i.e., off), and tunes to a 44.1 MHz center frequency when switching transistor Q202 is conducting (i.e., on).

Q201 is the final transmitter transistor amplifier. Its collector load is a tuned circuit comprising L201, C201, and C202 for the upper band. For the lower band, C203 is added in parallel with C202 by turning on switching transistor Q202 via a high level signal developed at a control output (C) of controller 230. C202 preferably has a value of 39 pf, and is coupled in parallel with the series combination of C201 (18 pf) and a capacitance of 470 pf which is internal to duplexer 210. This arrangement causes a resultant capacitance of 56.33 pf. The resultant 56.33 pf capacitance tunes with inductor L201 (set to a nominal value of 205 nH) to exhibit a parallel resonance frequency of 46.835 MHz (which for practical purposes is close enough to the 46.79 MHz center frequency of the upper band). When it is desired to tune the lower band, (e.g., in response to a change channel command near a band edge) controller 230 causes Q202 to turn on, which connects C203 (7 pf) in parallel with the previously calculated capacitance value to produce a new resultant value of 63.33 pf. This new capacitance value tunes with inductor L201 (205 nH) to exhibit a new resonance at 44.17 MHz (close enough for all practical purposes to the desired lower band center frequency of 44.1 MHz). Actual values may differ slightly due to stray capacitances, component values, and wire length.

Although the embodiment shown in FIGS. 1 and 2 was discussed above in terms of 25 cordless telephone channels, one skilled in the art will realize that the principles of the subject invention can be applied to a greater number of cordless telephone channels, if desired.

The term "controller" as used herein is intended to encompass microcomputers, microprocessors, and dedicated custom logic, and all are deemed to lie within the scope of the following claims.

What is claimed is:

1. A cordless telephone set, comprising:
   a handset for communicating to a base unit over a given number of channels via radio frequency (RF) signals coupled over a handset antenna, said handset having a handset controller;
   a base unit for communicating with said handset over said given number of channels via RF signals coupled over a base unit antenna, and for communicating with an external telephone network, said base unit having a base unit controller;

each of said handset and said base unit includes both transmitting and receiving circuitry;

said transmitting circuitry of said base unit, and said receiving circuitry of said handset require a greater bandwidth than said transmitting circuitry of said handset, and said receiving circuitry of said base unit;

said transmitting circuitry of said base unit including bandswitching circuitry, operating under control of said base unit controller, for selectively tuning a resonant circuit coupled to said base unit antenna to a first center frequency of a first band of frequencies, or to a second center frequency of a second band of frequencies; and said receiving circuitry of said handset including bandswitching circuitry, operating under control of said handset controller, for selectively tuning a resonant circuit coupled to said handset antenna to a first center frequency of a first band of frequencies, or to a second center frequency of a second band of frequencies.

2. The cordless telephone set of claim 1, wherein:

said bandswitching circuitry includes a capacitor for changing the resonant frequency of a tuned circuit, and a transistor switch for selectively connecting said capacitor to said tuned circuit.

3. The cordless telephone set of claim 2, wherein:

said bandswitching circuitry includes a second capacitor for changing the resonant frequency of a second tuned circuit coupled to an oscillator for selecting channels within a selected one of said first and second bands of frequencies, and a transistor switch for selectively connecting said capacitor to said second tuned circuit.

4. A cordless telephone set, comprising:

handset means for communicating to a base unit means over a given number of channels via radio frequency (RF) signals coupled over a handset antenna, said handset having a handset controller;

base unit means for communicating with said handset means over said given number of channels via RF signals coupled over a base unit antenna, and for communicating with an external telephone network, said base unit means having a base unit controller means;

said handset means and said base unit means including communication circuitry for communicating in a first direction and in a second direction, and channel allocation for communication in said first direction requires greater bandwidth than in said second direction; and in order to reduce noise, said communication circuitry employed in said first direction includes bandswitching means for selectively tuning said communication circuitry to a first center frequency of a first band of frequencies, or to a second center frequency of a second band of frequencies.

5. The cordless telephone set of claim 4, wherein:

said bandswitching means includes a first capacitor means for changing the resonant frequency of a first tuned circuit coupled to an antenna means, and a first switch means for selectively connecting said capacitor means to said tuned circuit.

6. The cordless telephone set of claim 5, wherein:

said handset means includes and oscillator means for selecting channels within a selected one of said first and second bands of frequencies, and said bandswitching means further includes a second capacitor for changing the resonant frequency of a second tuned circuit coupled to said oscillator means, and a second switch means for selectively connecting said capacitor means to said second tuned circuit.

* * * * *